(12) United States Patent
Durston et al.

(10) Patent No.: US 8,232,807 B2
(45) Date of Patent: Jul. 31, 2012

(54) APPARATUS FOR DETECTING IMBALANCES IN A PAIRED LINE

(75) Inventors: Thomas W. Durston, North Richland Hills, TX (US); Robert G. Crick, Ranco Santa Fe, CA (US)

(73) Assignee: Textron Innovations Inc., Providence, RI (US)

( * ) Notice: Subject to any disclaimer, the term of this patent is extended or adjusted under 35 U.S.C. 154(b) by 283 days.

(21) Appl. No.: 12/768,834

(22) Filed: Apr. 28, 2010

(65) Prior Publication Data

US 2010/0271039 A1   Oct. 28, 2010

Related U.S. Application Data

(63) Continuation-in-part of application No. 12/004,965, filed on Dec. 20, 2007, now Pat. No. 7,719,288, which is a continuation-in-part of application No. 11/977,572, filed on Oct. 25, 2007, now abandoned.

(60) Provisional application No. 60/854,290, filed on Oct. 25, 2006.

(51) Int. Cl.
*G01R 31/11* (2006.01)
*G01R 29/26* (2006.01)

(52) U.S. Cl. .................. 324/533; 324/613

(58) Field of Classification Search ........... 324/613, 324/612, 600, 522, 523, 524, 527, 528, 512, 324/539, 533, 532; 379/21–24, 30, 22.03, 379/22.07, 22.08
See application file for complete search history.

(56) References Cited

U.S. PATENT DOCUMENTS

| | | | |
|---|---|---|---|
| 4,361,894 A | 11/1982 | Kurihara et al. | |
| 4,517,531 A | 5/1985 | Tan et al. | |
| 4,611,101 A | 9/1986 | Walter et al. | |
| 5,157,336 A | 10/1992 | Crick | |
| 5,239,696 A | 8/1993 | Balch et al. | |
| 5,302,905 A | 4/1994 | Crick | |
| 6,177,801 B1 * | 1/2001 | Chong | 324/520 |
| 6,195,614 B1 | 2/2001 | Kochan | |
| 6,363,123 B1 | 3/2002 | Balodis | |
| 6,933,793 B2 | 8/2005 | Patterson et al. | |
| 6,940,973 B1 | 9/2005 | Yeap et al. | |
| 7,074,195 B2 | 7/2006 | Nelson et al. | |

OTHER PUBLICATIONS

Product brochure for Sidekick Plus Advanced Cable Maintenance Test Set, from Tempo—A Textron Company, copyright date 2005; (2 Pages).
Product brochure for Sidekick T&N, from Tempo Company, copyright date 2002; (1 page).

* cited by examiner

*Primary Examiner* — Hoai-An D Nguyen
(74) *Attorney, Agent, or Firm* — Clark Hill PLC (57) ABSTRACT

A device for measuring and isolating noise-creating imbalances in a paired telecommunications line has an internal circuit. The internal circuit includes a pulse generator. Pulses provided by the pulse generator are applied to an interface which includes balanced pathways to the conductors. The pulses are applied simplex (longitudinally) to the pair of conductors. Upon encountering a fault in the pair, a reflected metallic voltage signal is received by the interface. The reflected metallic voltage signal is sampled by an analog-to-digital converter. Data relating to the sampled signal is displayed for detection and location of faults on the pair.

24 Claims, 7 Drawing Sheets

APPARATUS FOR DETECTING IMBALANCES IN A PAIRED LINE

RELATED APPLICATIONS

This application is a continuation-in-part of U.S. application Ser. No. 12/004,965, filed on Dec. 20, 2007 which in turn is a continuation-in-part of U.S. application Ser. No. 11/977,572, filed Oct. 25, 2007 which in turn claims priority to U.S. provisional application Ser. No. 60/854,290 filed on Oct. 25, 2006.

BACKGROUND OF THE INVENTION

Paired lines are a conventional means of carrying telecommunications transmissions. A paired line is made up of two balanced conductors individually insulated and twisted together. Paired lines are typically bunched together in a cable termed a paired cable which contains up to one hundred or more paired lines, wherein each paired line is capable of independently carrying telecommunications signals. Paired lines are generally effective telecommunication carriers, however, it is not unusual for noise to occur in paired lines which is extremely disruptive to the clarity of the transmitted signal.

Transmission quality of a telephone line is directly proportional to the balance of the pair of conductors with respect to earth ground, or central office frame ground. A perfectly balanced pair has equal impedance on each conductor (tip and ring) with respect to ground, over the range of frequencies of interest, e.g. for voice grade lines the frequency range of interest is approximately 300 Hz to 3000 Hz. Imbalance results in noise on the line. When noise is reported in a paired telecommunications line, correction of the condition requires confirming the presence of the noise in the line by measuring its level and then isolating and locating the noise source for purposes of eliminating it. There is a wide range of noise sources for which detection is desirable since virtually any condition which can cause an imbalance between two conductors of a paired line can result in noise. Among the causes are series resistance faults, shunt resistance faults, cross faults, shunt capacitance faults, unbalanced series inductance, and power influence. These faults may, for example, be caused by water in the cable sheath, improper cable splicing, or faulty equipment attached to the pair.

Series resistance faults occur when there is a poor connection at a splice or wire termination, often resulting from a corroded joint. Shunt resistive faults occur when another body grounds a paired line. Cross faults occur when there is communication between adjacent paired lines in a cable. Shunt capacitance faults occur when one conductor of a pair is slightly longer than the other conductor, and the longer conductor possesses a higher capacitance to ground than the shorter conductor. Unbalanced series inductance occurs when only one half of a load coil is connected to a paired line at some point along the length of the line. Power influence is induced voltage from an ac power source adjacent to the paired line. Unlike the above-recited causes of imbalance, power influence imbalance can occur even when the paired line is apparently free of faults and appears balanced in the absence of the power influence.

Power influence, which as noted above is induced voltage from line to ground, most commonly occurs when the paired line is near a power line. In the United States, the power line frequency is typically 60 Hz, but power influence can likewise result from other power line frequencies, including 50 Hz, as typically found in many other parts of the world. Power influence can create unique problems for noise detection when it occurs in conjunction with a fault. For example, a series resistance fault may only produce a high level of noise when accompanied by a high power influence. Therefore, a noise caused by the fault may be observed by a user at a time of high power demand on a nearby power line, but when a repairman is dispatched to the site, the power demand and correspondingly the power influence may have diminished so that the noise resulting from the fault alone is no longer detectable by conventional detection devices. Accordingly, such a fault is very difficult to locate and repair.

Another detection problem results from the fact that power influence signals often do not create large longitudinal current flow. Such flow is necessary to detect series resistance faults because longitudinal current flow through a series resistance fault produces a voltage imbalance in the paired line which can be measured metallically. However, because conventional passive detection devices lack the ability to independently generate longitudinal current flow, they accordingly may fail to detect such faults where power influence is relied upon to generate longitudinal current flow.

Various attempts have been made to detect imbalances in paired lines. For example, time domain reflectometer (TDR) tests have been utilized to detect imbalances on the conductors of the pair. In these traditional TDR tests, a metallic signal is applied to the line under test for a brief period of time and the technician monitors a receiver to determine if a reflection of the applied signal is received. A metallic signal is one which is applied the conductors. A reflection of the applied metallic signal provides an indication that a fault on the line was encountered. The reflected metallic signal is received and analyzed. By operating in this send and listen type format, the technician can determine the nature and location of the fault. Because the applied pulse signal in a traditional TDR is metallic, the technician cannot tell whether the return pulse represents an imbalance fault (from one conductor to ground) or a metallic fault (across the conductors of the pair). Imbalance faults produce a smaller reflection of metallic pulses than the reflections produced by a metallic fault of the same impedance, so imbalance faults greater than approximately 1000Ω can not be reliably located with a traditional or metallic TDR. Because imbalance faults act as noise injection points, DSL traffic is much more sensitive to imbalance faults than to metallic faults. For pairs used to provide DSL service, therefore, it is desirable to be able to detect imbalance faults.

Another test for detecting imbalances in paired lines is the "stress test". The term stress test has become the accepted name for the test described in U.S. Pat. Nos. 5,157,336 and 5,302,905. The stress test provided a new way to test all cable pairs, working or dry, for proper balance. This test has become the telephone industry standard for determining the usability of a pair before placing it in service, and for isolating pair balance trouble to the source. A particular benefit of the stress test is in testing dry pairs before placing them into service as the test identifies "killer pairs" that tested good by previous methods yet tend to go bad within 48 hours after being placed in service.

Apparatus implementing the above stress test send out a simplex (both sides of the pair excited equally with respect to ground) "stress" tone through a balanced center tapped termination. Any imbalance on the pairs converted the simplex tone to metallic (across the conductors) which was amplified and filtered through a C Message filter. The filter output was converted to display either stressed noise or stressed balance, with stressed noise in dBrnC being the most popular.

The stress test simplex stress tone acted as an artificial "power influence" signal, permitting any pair's balance to be tested, even those pairs having too little power influence to allow a normal longitudinal balance reading. Longitudinal balance readings expressed the difference between passive power influence and noise metallic readings on the pair and thus did not place simplex excitation on the pair. The stress test internal termination to ground caused longitudinal current flow on the pair, revealing series resistance imbalances invisible to the longitudinal balance test. The pair can be tested from either end and does not require a termination in the central office.

The stress test concept for evaluating the voice transmission quality of a telephone line has been successfully applied in instruments such as Tempo's Sidekick® products. Tempo's Sidekick® testers have been used to stress voice frequency telephone lines by applying a 1 KHz simplex "stress" tone longitudinally, equal levels, same phase to tip and to ring, with reference to ground/cable shield. Any imbalance in the pair under test will result in a difference between signal amplitude on the tip and ring, and is measured across the pair (metallic). The larger the imbalance, the larger the 1 KHz metallic imbalance signal.

In addition, Tempo's Sidekick® testers provide for application of a high DC voltage along with the stress tone to determine the presence of moisture in the cable. If there is moisture present inside the cable sheath, the high voltage will create an ionization path and further degrade the balance of the pair under test. Normally, a good, balanced, non-wet pair will measure less than 30 dB stress, or less than 0.1% difference in levels across tip and ring as compared to the simplex stress tone.

A problem exists with the above stress test in that induction noise induced onto the tested pair in the voice band adds to the test signal converted from simplex to metallic by any imbalance on the pair causing high stressed noise and inferring poor pair balance when balance is not the source. In addition, high power influence can swamp out the applied simplex stress voltage causing erroneous high stressed noise readings. In areas with high power influence approaching or above the applied "stress" voltage, the stress test will erroneously read bad on good pairs. Thus, on noisy pairs you may not be measuring stressed noise, but induced noise converted from high power influence (50/60 Hz harmonics) on the pair due to the wideness of the C Message filter. This erroneous reading can cause technicians to try to improve pair balance rather than correcting high power influence, the true cause of the bad stress test indication. Therefore a "Voiceband Stress Test" is needed that can indicate the true stress balance of a pair in the voiceband with the presence of normal or high power influence.

Furthermore, the stress test as described above applies a simplex tone, in the voiceband typically near 1 kHz and indicates the balance of the pair at that frequency. Pairs that stress bad in the voiceband usually will not perform in the DSL band. A good stress test reading in the voice band however, does not necessarily indicate the pair will perform well in the DSL band. Minor capacitive or resistive imbalances that do not give a bad reading in the voiceband, can be service-affecting in the DSL bands.

A test is needed that performs similar to the voiceband stress test but is used for testing pairs in the DSL band and can therefore be used to isolate service-affecting DSL problems by technicians already familiar with using the stress test. Preferably, this test would quickly give a numeric readout allowing a confirmation that the pair is within parameters for, service.

A test is also needed which can detect higher impedance imbalance faults than a traditional or metallic TDR.

A test is needed which can be used on an in-service DSL circuit where a traditional TDR will not work.

For inactive pairs in a DSL service, a test is needed which can detect and locate imbalance faults in pairs for a wide range of frequencies, without requiring each frequency of interest to be separately examined.

SUMMARY OF THE INVENTION

The present invention relates generally to the detection of imbalances in a paired line. More particularly the present invention relates to the accurate measurement of pair balance or imbalances in a paired line in the presence of a high level of power influence or other interference, such as for example, AM radio broadcast and other RF transmitters up to an above 30 MHz More particularly still it relates to the detection of small pair imbalances that can affect the higher frequency signals communicated by ADSL and VDSL circuits but which may not be detectable with voiceband tests.

Apparatuses and methods for accurately detecting imbalances in a paired line in the presence of high power influence, and more particularly for the detection of more subtle imbalances that are only noticeable at frequencies in the DSL bands are provided. To test the balance of twisted pairs at frequencies far above the voiceband (>>3 KHz), the stress test concept is adapted in order to verify the quality of pairs used for DSL and other high frequency circuits. The apparatus provides a DSL stress numeric readout of balance or noise. A balance TDR trace that displays events that cause an imbalance on a pair also is provided.

The detecting device of the present invention can be in a self contained field portable unit consisting of a housing containing the internal measuring circuit and battery with a plurality of external leads extending from the housing. In another embodiment the measuring circuit can be included inside a multi-purpose test unit that combines the present test with other tests and displays the results on a common screen used to display this and other tests.

The internal circuit comprises a pair of substantially balanced AC current outlet pathways which extend in parallel from an AC current source. A ground pathway is connected to the AC current source and provides an earth ground against which the above preferred pulses are launched simplex on the conductors of the pair through the balanced outlet pathways. Voltage inlet pathways are provided to receive metallic or differential voltages from the conductors. If there is any imbalance between the two conductors, metallic voltage signals will be generated. Accordingly, the voltage inlet pathways will receive the voltages from the two conductors and feed the voltages to a differential amplifier. The output of the differential amplifier is transmitted to an analog-to-digital converter which samples the voltage. The digital signal produced by the A/D converter is processed by a microprocessor which also provides for adjustable and selectable bandpass filtering. A display is provided to visually display the output signal of the differential amplifier as a meaningful noise or balance measurement. The measurement can be provided either numerically or graphically. A graphical representation provides for a display of the amplitude of the metallic voltage signal vs. time or distance.

DETAILED DESCRIPTION OF PREFERRED EMBODIMENTS

While the present invention is susceptible of embodiment in various forms, as shown in the drawings, hereinafter will be described the presently preferred embodiments of the invention with the understanding that the present disclosure is to be considered as an exemplification of the invention, and is not intended to limit the invention to specific embodiments illustrated.

Figure 1:
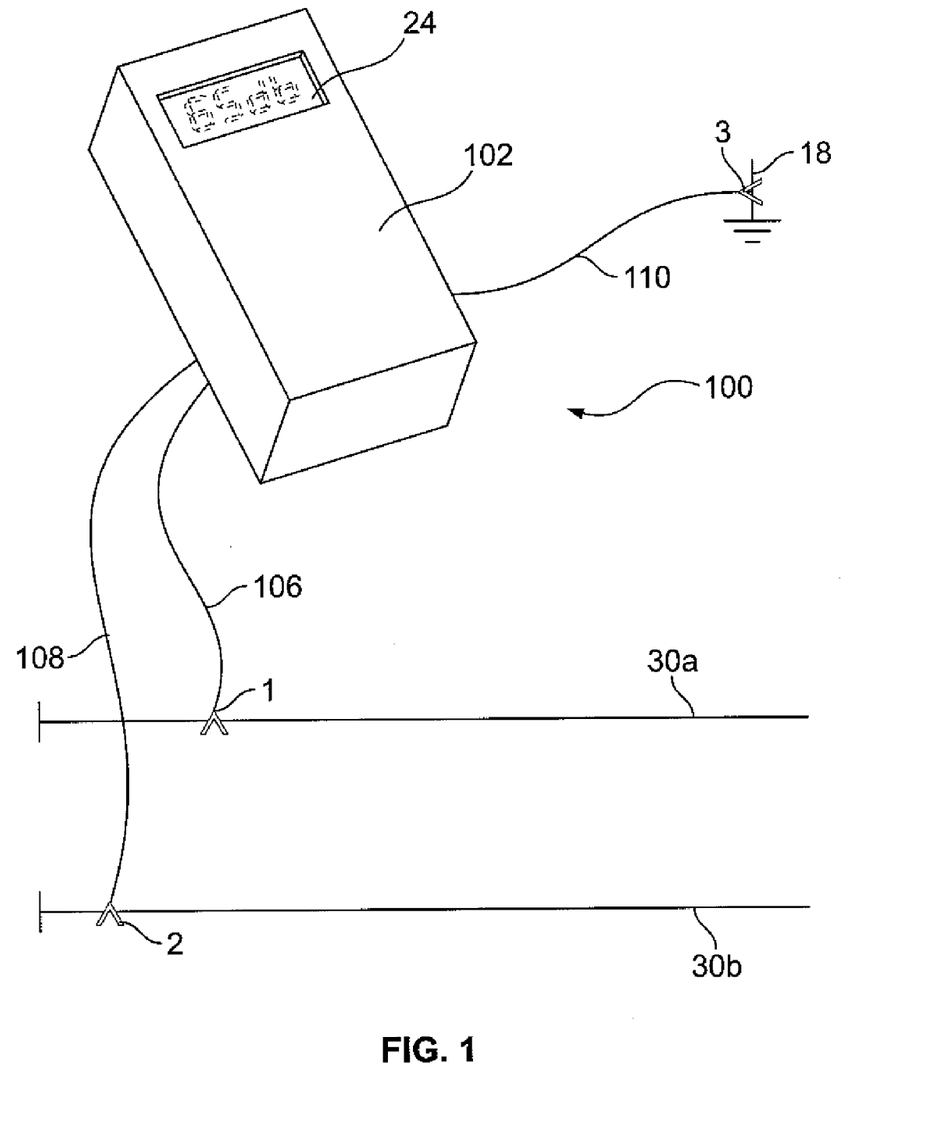
FIG. 1 is a perspective view of a hand-held apparatus in which the present invention can be incorporated.

FIG. 1 illustrates an embodiment of the test instrument 100 of the present invention. The test instrument 100 generally includes a housing 102, a display 24, a first conductor lead 106, a second conductor lead 108, and a ground lead 110. Circuitry of the test instrument is housed by the insulating housing 102 and will be explained in greater detail herein. The first conductor lead 106 provides an electrical connection between the circuitry of the test instrument 100 and the first conductor 30a (e.g. the tip of the twisted pair) by way of a test clip 1 and the second conductor lead 108 provides an electrical connection between the circuitry of the test instrument 100 and the second conductor 30b (e.g. the ring of the twisted pair) by way of a test clip 2. The ground lead 110 provides an electrical connection between the circuitry of the test instrument 100 and an external ground connection 18 by way of a test clip 3. The results of the tests performed by the test instrument 100 are displayed on the display 24 as will be described herein.

Figure 2:
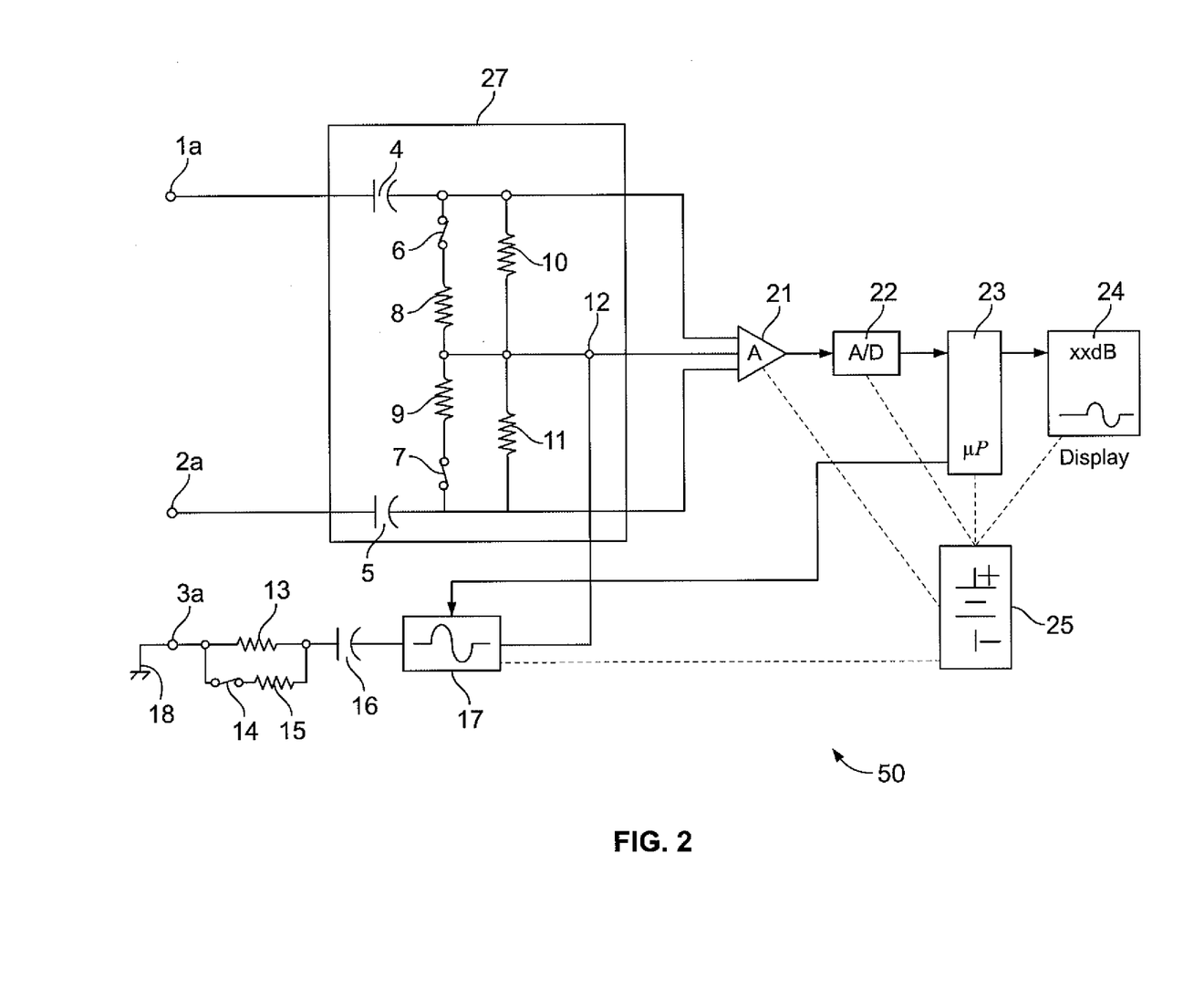
FIG. 2 is a diagram of a first embodiment of the circuitry of the present invention.

A first embodiment of an internal circuit 50 of the present invention 100 is illustrated in FIG. 2. The internal circuit 50 comprises a balanced center tapped termination consisting of precisely equal resistor pairs whose purpose is to drive precisely equal test currents into both sides of the tested pair with respect to ground. This is commonly termed as simplex excitation of the pair. Contacts 1a and 2a receive first and second conductor leads 106, 108 respectively to removably connect the internal circuit of the test instrument 100 to the first and second conductors 30a, 30b of the pair to be tested. Contact 3a receives the ground lead 110 to removably connect the internal circuit of the test instrument 100 to the earth ground 18.

As shown in FIG. 2, the circuit of the present invention may include switches 6, 7, and 14, shown in a closed state. The values of resistors 8 and 9 are chosen to be precisely balanced as are resistors 10 and 11. Resistors 8, 9, 10, and 11 are all returned to circuit reference 12, which serves as a floating circuit reference point for a sine wave burst generator 17 and amplifier 21. With switch 6 closed, resistors 8 and 10 are paralleled. With switch 7 closed, resistors 9 and 11 are paralleled. Paralleled resistors 8 and 10 couple from circuit reference 12 through capacitor 4 and contact 1 to one conductor of the tested pair. Paralleled resistors 9 and 11 couple from circuit reference 12 through capacitor 5 and contact 2 to the other conductor of the tested pair.

Since resistors 8 and 9 are precisely balanced as are resistors 10 and 11, their parallel combination will also be precisely balanced. The paralleled resistors form a balanced center tapped network 27 whose center tap is represented by circuit reference 12.

Capacitors 4 and 5 are chosen to present precisely equal impedance to all test frequencies while not passing DC voltage that can be present on the pair. Therefore contacts 1 and 2 see precisely equal impedances through a balanced center tapped network 27 back to circuit reference 12. As a result of this balanced center tapped network 27, when circuit reference 12 is driven with respect to earth ground by an alternating current source 17, precisely equal currents will be driven into the two conductors of a balanced tested pair. Any imbalance on the pair will create a metallic voltage between its two conductors and this voltage is amplified and processed to be read out by the display 24.

The alternating current source 17 provides alternating current signals having a plurality of shapes including square wave and other wave shapes. In the event it is desired to test pairs without interfering with DSL traffic on the pair, sine waves, which have fewer interfering harmonics, can be used. It is understood, however, that other wave shapes can be used effectively in the present apparatus when there is no need to minimize interference on the pair, such as when testing out of service pairs. The AC source 17 is capable of generating, for example, sine waves at multiple frequencies, typically 1 KHz for the Voiceband Stress Test, 200 KHz and 1 MHz for the ADSL Stress Test, and 1 MHz and 5 MHz for the VDSL Stress Test. These are representative frequencies and a wide range of frequencies can be used within the spirit of this invention. In addition to continuous sine waves, the alternating current source 17 can be strobed to deliver a single full cycle of a sine wave (a pulse) or a strobe of multiple whole cycles (a burst), and these pulses/bursts are typically repeated at a strobe rate. Preferably, the alternating current source 17 produces bursts of 100 cycles for the voiceband stress test. For the DSL stress tests the AC source 17 produces only a burst of 10 or less cycles of sine wave before pausing, and even more preferably, the AC source 17 produces only a single sine wave pulse before pausing. The duration of the pause is selected to allow all pulse returns to clear the longest pair to be tested during the pause.

A sine wave cycle, beginning and ending at zero crossings, has the advantage that it produces no subharmonics below its fundamental frequency, and no artifacts at the strobe rate frequency or its harmonics. Thus for sine wave frequencies above the voiceband there will be no audible frequencies generated in the voiceband by the strobing process, and no interference with conversation on the pair. This contrasts with raised cosine pulses typical of a standard TDR, which produce loud audible sounds at the strobe rate and harmonics of that rate. Raised cosine pulses may be used with the present invention on nonworking lines where the audible sounds would not be interfering.

Strobed sine waves can also be lowpass filtered above the third or fifth harmonic and still have useable resulting waveshapes. Thus interference in the DSL bands from these pulses can be managed, since the pulse spectrum can be limited to controllable bands. Proper filtering will allow testing by sending pulses simplex on a working pair without knocking down DSL or voice service.

One side of AC source 17 is coupled through capacitor 16, then through resistors 13 and 15 in parallel due to the closed switch 14, to contact 3 which is typically a test clip that is removably connected to earth ground 18. The other side of AC current source 17 is connected to circuit reference 12. As a result of this connection, AC current source 17 will impose voltage pulses between earth ground and circuit reference 12, resulting in current bursts flowing from circuit reference 12 through the balanced center tapped network onto both conductors of the pair connected to contacts 1a and 2a. The balanced center tapped network 27 therefore provides and interface between the AC source 17 and the conductors 30a, 30b.

In the case of sending megahertz pulses for testing DSL pairs, the impedance between the conductors, the metallic impedance, should be matched to the impedance of the tested pair; about 125 ohms. The parallel combination of resistors 8 and 10 and that of resistors 9 and 11 form the balanced center tapped termination 27 so each parallel resistor combination should be 62.5 ohms. The two sides of the balanced center tapped termination appear in parallel to simplex pulses so the simplex impedance would be 31.25 ohms. In some cases a higher simplex impedance would be desirable to match the cable, so the parallel combination of resistors 13 and 15 would be chosen so it will add to the balanced center tapped termination simplex impedance to achieve the desired overall simplex impedance for launching simplex sine wave bursts.

In the case of voiceband testing, it may be desirable to terminate with an impedance of 600 or 900 ohms. In this case switches 6 and 7 are opened in order to have resistors 10 and 11 provide the desired metallic impedance. Furthermore, switch 14 is opened in order to have resistor 13 build out to the desired simplex impedance. Thus, resistors 10, 11, and 13 are first chosen to provide the desired voiceband impedance. Then resistors 8, 9, and 15 are chosen to give the desired high frequency impedance when switches 6, 7, and 14 are closed. Switches 6, 7, 14 and resistors 8, 9, 15 would not be required if matching multiple impedances were not required.

Strobed bursts can be expanded to a continuous wave if desired for testing, or the strobe width can be reduced to deliver single cycle pulses, for example, a single sine cycle pulse if so desired. For a stress test of pairs to be used for voiceband service, i.e. a voiceband stress test a continuous non-strobed sine wave, for example, can be sent in a similar fashion as in the older stress test. For a stress test of pair to be used for DSL service, i.e. a DSL stress test and in particular a DSL stress test utilizing a balance TDR trace, single cycles would be preferred.

As illustrated in FIG. 2, the circuit of the present invention includes a differential amplifier 21, an analog-to-digital converter 22, a microprocessor 23, and display 24. Amplifier 21 is a balanced input amplifier responsive to all test frequencies to be impressed onto the pairs up to tens of megahertz in some cases. It has a very high common mode rejection ratio in order to keep the simplex bursts from appearing at its output. The amplifier 21 output, in turn, connects to the input of the analog-to-digital (A/D) converter 22. The A/D converter 22 is capable of sampling the voltage at the rate necessary for computation of the displayed results.

Microprocessor 23 controls the A/D converter 22, collects the samples in an array, and filters the results for presentation on the display 24. Advantageously, the microprocessor provides for adjustable and selectable digital bandpass filtering. At 1 kHz the preferred bandpass is 3 Hz. Preferred bandpass filtering occurs at 200 KHz, 1 MHz, and 5 MHz with a preferred frequency bandpass of 3 harmonics to provide bandpass ranges of 200-600 KHz, 1-3 MHz, and 5-15 MHz, respectively. These frequencies and bandpass ranges are considered preferred, and additional frequencies and passbands, such as 5 or even 7 harmonics may be employed within the spirit of the invention.

As illustrated in FIGS. 1 and 2, the circuit includes a battery 25 providing power to AC source 17, differential amplifier 21, analog-to-digital converter 22, microprocessor 23 and display 24. The display 24 would typically be an LCD display, and it preferably includes graphical capability if a display of waveforms is desired.

In operation, the circuit 50 can be employed for locating imbalances at various frequencies in various paired line constructions 30. For example, in a first application the circuit 50 provides a voice band stress test. In this application, one adjusts the microprocessor 23 to provide a low frequency bandpass, such as a 3 Hz bandpass filter which will give a reduction of 31 to 1 of any power harmonics present on the pair. The simplex excitation tone frequency must be positioned between the 60 Hz power harmonics so as not to have any power harmonic fall within the filter passband. Thus, if the test frequency is positioned half way between 60 Hz harmonics, its bandwidth should be less than 60 Hz so as to adequately attenuate the 60 Hz harmonics immediately above and below the test frequency. 1 kHz does not lie half way between the 960 Hz and 1020 Hz harmonies but the 3 Hz stated preferred bandwidth will adequately attenuate the 1020 Hz closest harmonic. This voiceband stress test with good filtering can reliably indicate pair stressed balance or stressed noise even with high power influence on the pair. It will eliminate the need for comparing readings on other pairs in the cable in order to qualify whether a stress test reading is being corrupted by power influence. The voiceband stress test will give an accurate indication of pair balance in the voice band in any situation, and is an improvement of the older stress test.

In a second application the circuit 50 provides a DSL stress tress. In this application, a very quick test of a working DSL or data line can be made by applying a stressed noise tone at a frequency in the DSL band simplex on the pair 30 through a balanced network 27 and monitoring the conversion to metallic in order to display balance. This balance test can be bridged on anywhere along the line 30 and will quickly identify intermittent lines with high joints (series resistance faults) or capacitance imbalances without taking than out of service. In addition this test can be used on dry pairs or nonworking DSL circuits.

A fixed frequency is applied simplex to the pair through an interface provided by the balanced network 27, to produce a minimal interference in the DSL modems. It could be positioned near 200 kHz at the quiet spot between the upstream and downstream bands or at any other point that would produce minimum interference with the modems. It would also be positioned between 60 Hz harmonics. For VDSL circuits, a higher test frequency can be selected. The balanced termination would have a high impedance bridging mode when connected between the modems, and a pair impedance matching terminate mode for testing out-of-service pairs from one end.

The displayed metallic signal (DSL stressed noise or balance) would be from a narrow band coherent filter to avoid displaying the DSL traffic. The readout would be either stressed noise or stressed balance. On lines where the DSL modems are not active, or between modem training polls, frequencies that could otherwise interfere with active modem traffic can be sent. In this case, the transmitted pulses will be repeated at successively shorter pulsewidths in order to scan through a range of transmitted frequencies. As a result, unbalanced jumpers or taps can be detected by essentially sweeping the frequency of the transmitted simplex pulses.

In a third application, the circuit 50 provides a DSL stress test which utilizes attenuation correction and is used to detect imbalances at the ADSL and VDSL bands. At frequencies in the upper ADSL, band, and to a greater extent in the upper VDSL band, pair attenuation will cause service affecting imbalances at the far end of the pair to be much weaker when they return. Some will be so attenuated as to be overlooked at the near end making the test unusable unless corrected.

In order to provide digital processing, to compensate for attenuation, we will apply strobed bursts of the test sine wave as simplex excitation. These bursts could be from a single cycle to tens of cycles. The maximum number of cycles is determined by the time delay of the length of the pair and the method of display. Thus the ADSL stress test or VDSL stress test will operate in a send/listen format similar to that of a traditional TDR, however, unlike a traditional TDR, the applied signal will be provided to conductors 30a, 30b simplex rather than metallic. Upon sending a single cycle pulse simplex, the metallic voltage signal provided by the differential amplifier 21 is sampled at, for example, 8 samples per cycle. The samples are stored in the first row of an array whose width equals the time delay of the longest line to be tested. Each successive stored sample would represent a greater delay from the pulse transmission time. A second pulse is sent and the resulting reflections are stored in the second row of the array, and the process repeats. Several rows of the array are column averaged and the average stored in an Averaged Row. The stored points in this row can be painted on a graphical display to produce a filtered return pulse waveform. This balance TDR waveform (i.e. a TDR trace representing the balance or imbalance between the conductors 30a, 30b) resembles a traditional TDR trace with a very wide transmit pulse. Increasing the number of samples per cycle improves the resolution, reducing the number of samples allows a slower processor to be used.

To compensate for attenuation, the samples in the Averaged Row are then multiplied by attenuation correction multipliers to correct for pair attenuation at the frequency of the pulse. The attenuation correction multipliers ramp upward with distance (time) from the transmit pulse, depending on the attenuation of the gauge chosen by the user for the pair. The corrected values are stored in a Corrected Row which would be the ideal row to paint to a graphical display representing a simplex to metallic pulse return. After correction, an imbalance of a given impedance will give the same amplitude return from the far end of the pair as from the near end.

The peak value from the Corrected Row is then displayed numerically as DSL Stressed Noise. Alternatively, this number can be compared with the transmit amplitude to display DSL Stressed Balance. To accommodate all forms of ADSL and VDSL, several test frequency bands will be selectable.

Advantageously, a rough numerical distance reading can be computed from the above array data, which will tell if the fault is near or far. The array would be scanned and the displayed distance would be computed from the time delay from simplex pulse transmit to receipt of the strongest metallic return pulse. Thus a rough digital distance reading can be part of the display. The use of sine wave pulses enhances the accuracy of this measurement as they have a zero crossing that is easy to accurately locate with the microprocessor.

Figure 3:
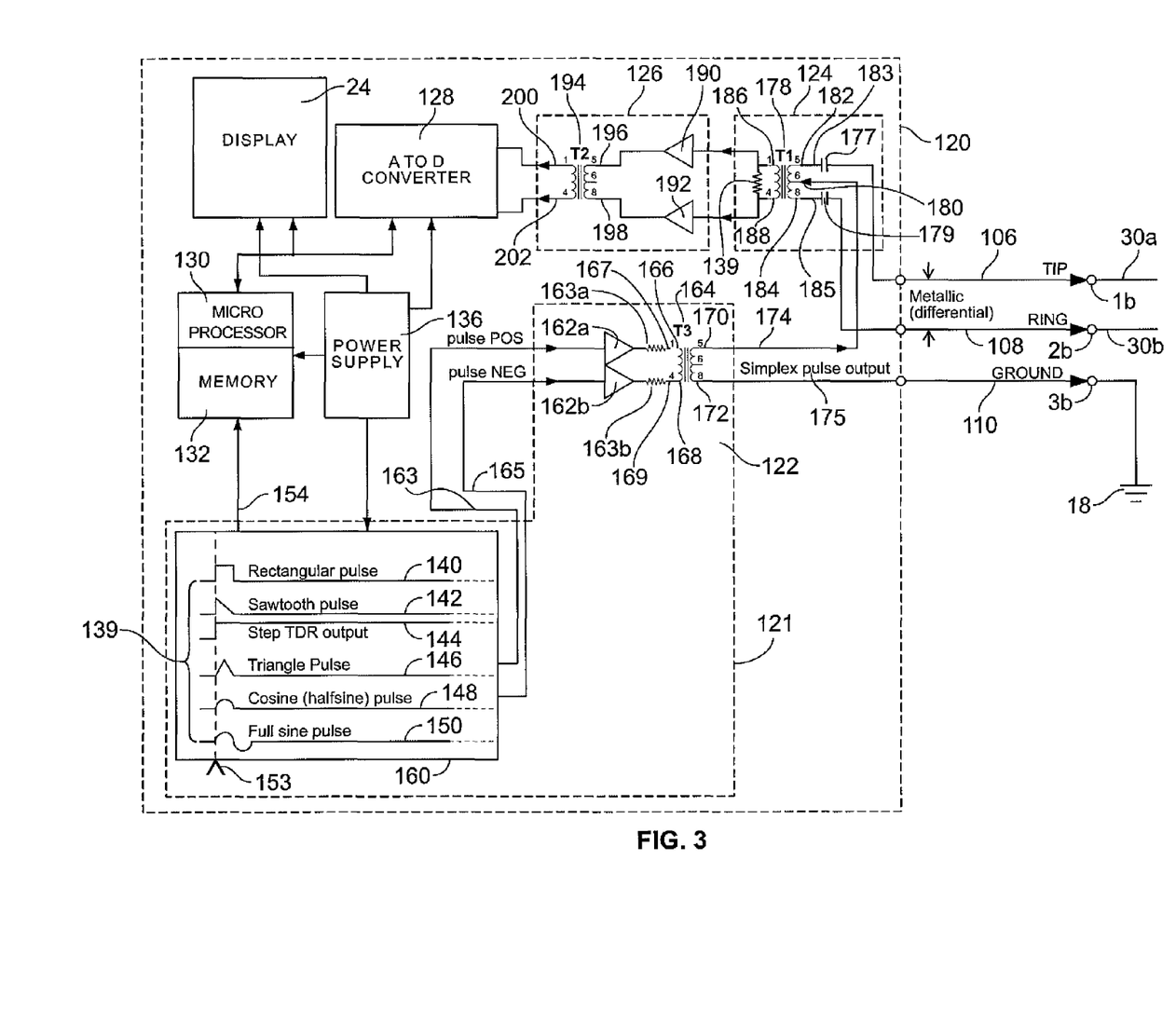
FIG. 3 is a diagram illustrating a second embodiment of the circuitry of the present invention.

An alternate embodiment of the internal circuitry 120 of the test instrument 100 is illustrated in the block diagram of FIG. 3. Contacts 1b and 2b receive first and second conductor leads 106, 108 respectively to removably connect the internal circuitry 120 of the test instrument 100 to the first and second conductors 30a, 30b of the pair to be tested. Contact 3b receives the ground lead 110 to removably connect the internal circuitry 120 of the test instrument 100 to the earth ground 18.

The circuitry 120 includes a time domain reflectometer pulse generator 121, a metallic receiver interface 124, a differential receiver amplifier 126, an analog to digital converter 128, a microprocessor 130, a memory 132, the display system 24, and a power supply 136.

The time domain reflectometer (TDR) pulse generator 121 includes a pulse transmission source 160 for providing TDR pulses having a variety of shapes as will be described herein, a time base 153 for providing a time base signal upon initiation of a TDR pulse, and a simplex pulse transmitter 122. The pulse transmission source 160 can be for example a digital-to-analog converter.

The simplex pulse transmitter 122 preferably has a bandwidth from 20 KHz to 300 MHz. The simplex pulse transmitter 122 includes first and second TDR pulse amplifiers 162a, 162b, first and second simplex terminating resistors 163a, 163b and a transmission transformer 164. The transmission transformer 164 includes a first input terminal 166 at pin 1, a second input terminal 168 at pin 4, a first output terminal 170 at pin 5, and a second output terminal 172 at pin 8. The second output terminal 172 is electrically connected to earth ground 18 through test lead 110. The first output terminal 170 is connected through lead 174 to metallic receiver interface 124.

The metallic receiver interface 124 preferably has, in some instances, a bandwidth from 20 KHz to 300 MHz for example. In other instances, for example when DSL signals are to be provided on the conductors 30a, 30b, the metallic receiver interface 124 preferably has a bandwidth from 20 KHz to 35 MHz The receiver interface 124 includes a receiver transformer 178, a first DC blocking capacitor 177, a second DC blocking capacitor 179, and a metallic terminating resistor 189. The receiver transformer 178 includes a center tap 180 at pin 6, a first input terminal 182 at pin 5, a second input terminal 184 at pin 8, a first output terminal 186 at pin 1 and a second output terminal 188 at pin 4. The metallic terminating resistor 189 connects across first and second output terminals 186, 188. A simplex pulse connection 174 is provided between first output 170 of transmission transformer 164 and the center tap 180 of the receiver transformer 178.

The differential receiver amplifier 126 preferably includes a first amplifier 190, a second amplifier 192, and a coupling transformer 194. The coupling transformer 194 includes a first input terminal 196 at pin 5, second input terminal 198 at pin 8, a first output terminal 200 at pin 1, and a second output terminal 202 at pin 4.

Figure 4:
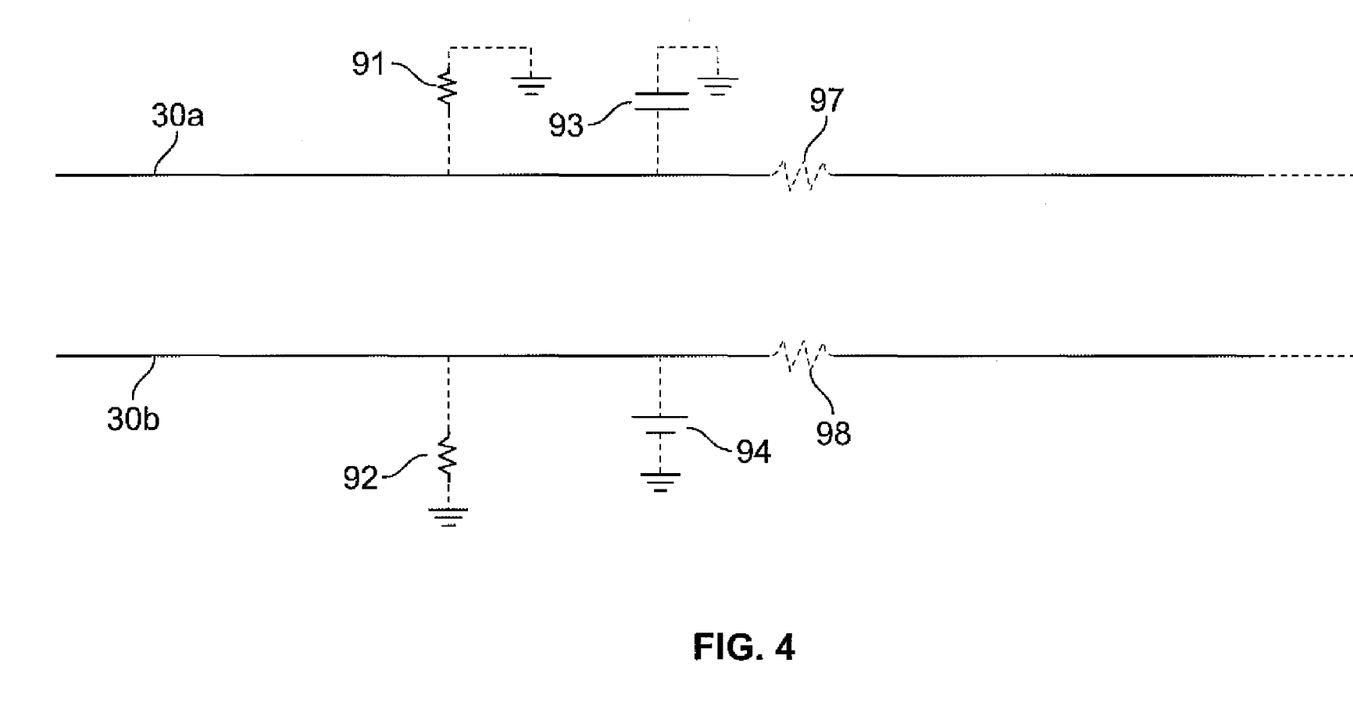
FIG. 4 illustrates different types of fault encountered on paired lines.

Operation of the circuitry 120 of the test instrument 100 for the purpose of locating and identifying a fault in a pair of conductors 30a, 30b will now be described. Examples of different types of fault on the pair 30a, 30b to be detected with the test instrument are illustrated in FIG. 4. The fault to be detected can be for instance, a resistive fault between tip and ground as shown at 91, a resistive fault between ring and ground as shown at 92, a capacitive fault between tip and ground as shown at 93, a capacitive fault between ring and ground as shown at 94, a series resistance fault in the tip conductor 30a, as shown at 97, or a series resistance fault in the ring conductor 30b as shown at 98. It is to be understood detection of a combination of these types of faults can be accomplished with the apparatus 100 as well.

Initiation of a test on a pair of conductors 30a, 30b begins by connecting the ground lead 110 to the earth ground 18, connecting the first lead 106 to the first conductor or tip 30a of the pair, and connecting the second lead 108 to the second conductor or ring 30b of the pair.

Next, utilizing the pulse transmission source 160, a TDR pulse 139 is initiated to apply a stress signal to the conductors 30a, 30b of the pair. The waveforms for the TDR pulses 139 can be any one of a number of shapes. Examples of the different waveforms to be provided by the transmission source 160 are illustrated and include: a rectangular waveform 140, a sawtooth waveform 142, a step waveform 144, a triangle waveform 146, a cosine (or half sine) waveform 148, or a full sine waveform 150. While each of these waveform shapes may be useful in applying a stress signal to the conductor, those waveforms which have a wideband harmonic content may be of greater utility in some instances. For example, rectangle, triangle, sawtooth and step wave shapes contain their fundamental frequencies plus many harmonics with high frequency energy and therefore are said to include wideband harmonic content. In contrast, a sine wave shape generally relates to a single frequency.

The transmission source 160 can be, for example, a transmission source such as that used in traditional TDR apparatuses which is capable of providing square wave shapes of various pulse widths that approximate the harmonic content of a square wave. Each TDR pulse 139 having a square wave shape, therefore, contains a multitude of odd harmonics, covering the full range of frequencies used in DSL transmission. The TDR pulses 139 provide energy to the conductors 30a, 30b which is reflected from an impedance change as will be described herein. The reflections of those TDR pulses, such as the rectangular pulse, the sawtooth pulse or the step pulse, which include a sharp rising edge will include sharply changing voltages and allow for the location of the fault to be more easily determined. In contrast, the reflections of those TDR pulses which are gently changing such as the sine pulses do not include sharply changing voltages and although such pulse can be utilized, the location of the fault using these waveforms may be more difficult to detect. For example, when using a sine wave pulse 150, an iterative process wherein the frequency of the sine wave is adjusted may assist in identifying the presence and magnitude of the fault. As with the circuitry 50 illustrated in FIG. 2, the duration for which the TDR pulses 163, 165 are applied to conductors 30a, 30b of the line under test is relatively short. More specifically and in contrast with the old stress test which applied a continuous alternating current signal to the line under test, TDR pulses are provided by the pulse generator 160. TDR pulses are those pulses having a duration sufficiently short such that the TDR pulses applied to the conductors 30a, 30b of the line under test are normally completed prior to receipt of the reflected pulses at the receiver 124. Because the simplex pulse output signal 175 does not appear at the input of the differential receiver amplifier 126 except when an imbalance fault is present, imbalance faults are clearly displayed even when they are so close the reflected pulse arrives before the end of the output simplex pulse. In the instance where the TDR pulse is, for example, a step pulse such as the step pulse 144, charging of the capacitors 177, 179 must also be considered. In the case of a step pulse 144, the output terminals 186, 188 of the receiver transformer 178 will provide a metallic voltage signal only until such time as the capacitors 177, 179 are not fully charged. Once capacitors 177, 179 are charged, the stepped pulse 144 will be blocked and no longer available at the output terminals 186, 188.

Upon initiation of the TDR pulse, a tune base 153 provides a pulse initiation signal 154 to the microprocessor 130 to provide an indication regarding the initiation of each of the waveforms as shown at 160.

The initiated TDR pulse 139 includes a positive pulse signal 163 and a negative pulse signal 165. The positive pulse signal 163 and the negative pulse signal 165 are identical signals with the exception that the polarity of the positive pulse signal 163 is opposite the polarity of the negative pulse signal 165.

The positive pulse signal 163 is provided to first amplifier 162a and simplex terminating resistor 163a to provide an amplified positive pulse signal 167. The negative pulse signal 165 is provided to second amplifier 162b and simplex terminating resistor 163b to provide an amplified negative pulse signal 169. Simplex terminating resistors 163a, 163b are chosen to match the simplex impedance of the pair 30a, 30b to facilitate simplex pulse launch and to dampen simplex reflections on the pair. The amplified positive pulse signal 167 is applied to the first input terminal 166 of the transmission transformer 164 and the amplified negative pulse signal 169 is applied to the second input terminal 168 of the transmission transformer 164. The transmission transformer 164 serves to sum the amplified positive pulse signal 167 and the amplified negative pulse signal 169 and to provide a simplex pulse output signal 175 at the second output 172 of the transmission transformer 164. In this manner, the magnitude of the simplex pulse output signal 175 is increased while the internal common mode noise portions of the pulse positive signal 163 and pulse negative signal 165 are substantially cancelled, thereby achieving a greater signal to noise ratio for the simplex pulse signal 175 at the simplex pulse connection 174.

The simplex pulse output signal 175 of the transmission transformer 164 is applied longitudinally, i.e. simplex, to the center tap 180 of the receiver transformer 178. The windings between the center tap 180 and the first output terminal 182 and the windings between the center tap 180 and the second output terminal 184 are equal creating identical voltage signals at the first and second output terminals 182, 184. With the TDR pulses applied longitudinally to conductors 30a, 30b relative to ground 18 via the center tap 180 of the receiver transformer 178 a balanced network is provided and there is no differential voltage across the input of the receiver transformer 178. The first simplex pulse output signal 183 is applied to the first conductor or tip 30a of the pair via the DC blocking capacitor 177 and the first test lead 106. The second simplex pulse output signal 185 is applied to the second conductor or ring 30b of the pair via the DC blocking capacitor 179 and the second test lead 108.

The simplex output signals 183, 185 travel through conductors 30a, 30b. When a fault (for example, a fault illustrated in FIG. 4), is encountered, a metallic or differential voltage signal is reflected back to the first and second input terminals 182, 184 of the receiver transformer 178, i.e. any imbalance in the pair under test will result in a difference between signal amplitude on the conductors 30a, 30b and is measured across the pair (metallic). The differential voltage is therefore sensed by the receiver transformer 178 and a metallic voltage signal is provided at output terminals 186, 188 of the receiver transformer 178. The value of metallic terminating resistor 189 is chosen to provide metallic impedance matching of conductors 30a, 30b in order to dampen metallic reflections on the pair. The receiver transformer 178 provides for isolation between the output terminals 186, 188 on which the metallic voltage signals is provided and the simplex pulse output signal 175 of the transmission transformer 164. In addition DC voltages from the conductors 30a, 30b of the line under test are isolated from the receiver transformer 178 via capacitors 177, 179.

The metallic voltage signal provided by output terminals 186, 188 of the receiver transformer 178 is transmitted to the amplifier 126. The metallic voltage signal at the first output terminal 186 is equivalent to the metallic voltage signal at the second output terminal 188 however, the polarity of the metallic voltage signal at the first output terminal 186 will be opposite the polarity of the metallic voltage signal at the second output terminal 188. The metallic voltage signal at the first output terminal 186 of the receiver transformer 178 is provided to a first input terminal 196 of the coupling transformer 194 via the first amplifier 190 and the metallic voltage signal at the second output terminal 188 of the receiver transformer 178 is provided to a second input terminal 198 of the coupling transformer 194 via the second amplifier 192. Due to the opposite polarities of the signals at input terminals 196, 198, the internal common mode noise portion of the signals will be substantially eliminated however, the metallic voltage portion of the signals will be doubled. This metallic voltage signal which has been amplified and from which noise has been eliminated is provided at the output terminals 200, 202 of the coupling transformer 194.

Metallic voltage signals at the output terminals 200, 202 of the coupling transformer 194 are then provided to the analog-to-digital converter 128. As noted above, upon initiation of the TDR pulses by the pulse generator 160, the time base 153 via the microprocessor 130 triggers the analog-to-digital converter 128 to continuously sample the received voltage relative to the launch of the outgoing simplex pulse 175. The analog-to-digital converter 128 provides sampling of the metallic voltage signals received and provides the sampled data to the microprocessor 130 and the memory 132. The microprocessor 130 is configured to provide a meaningful display of the data received.

The data received by the microprocessor 130 can be presented to the technician in a variety of formats. One format provides for a numerical display of the data. For example, the received data is store in the memory 132. The microprocessor 130 is configured to determine a peak metallic voltage from the stored date. Upon determining the peak metallic voltage, the microprocessor 130 determines the time delay from initiation of the pulse to receipt to the peak metallic voltage. Using the time delay, the distance to the fault which generated the peak metallic voltage is calculated. Finally, the peak metallic voltage along with the calculated distance to the fault is displayed on the display 24.

In another format a graphical display relating to the sampled voltages is provided. In this format the microprocessor 130 is configured to utilize the received metallic voltage data and provide a plot of the amplitude of the metallic voltage versus time elapsed or distance. This plot is referred to herein as a balance TDR trace. This graphical representation or balance TDR trace allows the technician to readily identify a point of imbalance. By analyzing the data and/or graphical representation of the data at the point of imbalance, the technician is able to determine the magnitude of the fault and the distance to the fault thereby allowing the fault to be more easily located. Examples of balance TDR traces provided by the test instrument 100 and having the circuitry 120 illustrated in FIG. 3 are illustrated in FIGS. 5-9.

FIGS. 5-9 illustrate balance TDR trace summaries displayed on the display 24 of the test instrument 100 having internal circuitry 120 upon use of the test instrument 100 in connection with a pair of conductors 30a, 30b. The conductors 30a, 30b are provided in a CAT5, 4 pair, 24 AWG shielded LAN cable to which faults were provided in order to demonstrate the detection and identification capabilities of the test instrument 100. The length of the cable utilized was approximately 959 feet long. With no balance impairment added, the capacitance tip to ground (i.e. longitudinal) is 16.50 per foot and the capacitance ring to ground (i.e. longitudinal) is 17 pF per foot.

As illustrated in FIG. 3, the first lead 106 of the test instrument 100 is connected to the first conductor or tip 30a of the pair and the second lead 108 is connected to the second conductor or ring 30b of the pair. The technician utilizes the microprocessor 130 to adjust the gain of the amplifiers 190, 192 to provide an appropriate gain, for example, a gain of 22 to the metallic voltage signal. A rectangular TDR pulse, such as the TDR pulse 140, is then initiated and applied to the first and second conductors 30a, 30b. For the traces provided in FIGS. 5-9, a 50 ns pulse width was utilized. Upon initiation of the TDR pulse, a time initiation signal 154 is simultaneously provided to the microprocessor 130 which in turns provides a signal to the analog-to-digital converter 128 to initiate sampling of the metallic voltage signals received by the receiver 124. The data obtained from the sampled voltage provides the traces 210, 220, 230, 240, 250 illustrated in FIGS. 5-9. For each trace provided, the X-axis 212 of the display 24 represents distance and the Y-axis 214 represents the amplitude of the sampled voltage signal. The balance TDR trace 210 therefore is illustrated as a function of the amplitude of the voltage signal over time.

Figure 5:
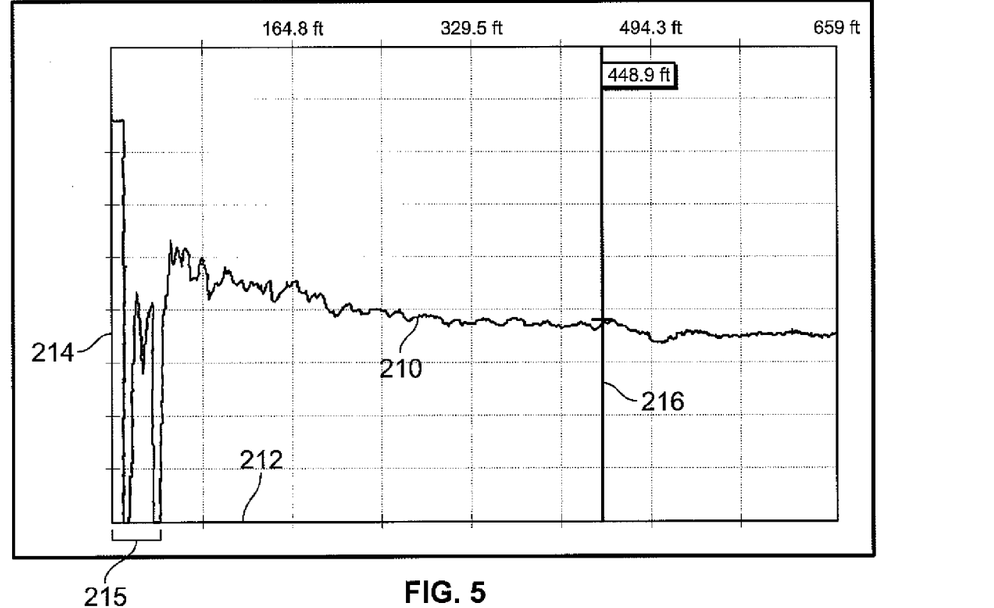
FIG. 5 is a view of the display of the present invention upon application of the test instrument to a fault free pair.

With respect to FIG. 5, other than initial disturbances in the balance TDR trace 210 over approximately the first 100 feet of the pair (illustrated at 215) and the relatively steady decreases in the amplitude of the voltage as the distance increase, the voltage signal is relatively steady indicating a lack of reflected metallic voltages. The initial disturbances at 215 do not relate to faults in the pair but rather relate to connection of the test leads 106, 108 to the conductors 30a, 30b. As the remainder of the trace is examined, slight disturbances are observed in the balance TDR trace. An example of a slight disturbance is indicated by the cursor or indicator bar 216. This disturbance relates to a splice in the conductors 30a, 30b of the pair. The slight imbalance is due to untwisting of the pair 30a, 30b over a length of approximately 5 inches. As only slight disturbances are illustrated in the balance TDR trace 210, the trace indicates that the pair is free of faults.

Figure 6:
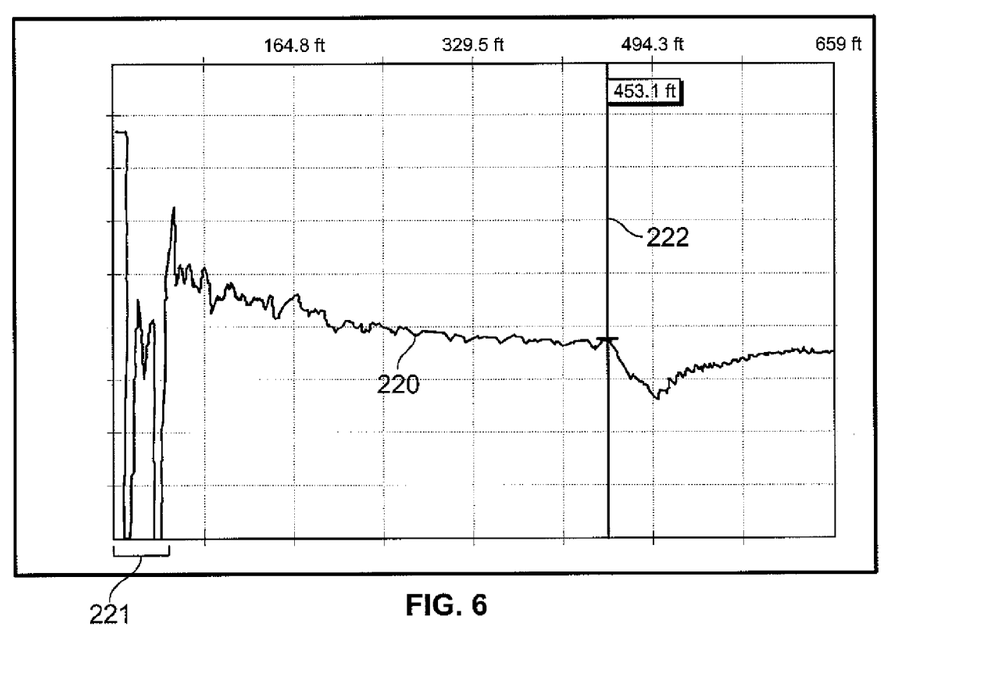
FIG. 6 is a view of the display of the present invention upon application of the test instrument to a pair including a 2500Ω resistance fault between tip and ground.

A balance TDR trace 220 is illustrated in FIG. 6. As with the balance TDR trace 210, the technician, utilizing the microprocessor 130, has applied a gain of 22 to the metallic voltage signal, a rectangular TDR pulse is initiated and applied to the first and second conductors 30a, 30b along with a time initiation signal 154 which is simultaneously provided to the microprocessor 130. The data obtained from the sampled voltage provides the balance TDR trace 220. Again the initial disturbances provided in the balance TDR trace 220 over approximately the first 100 feet of the pair (illustrated at 221) are due to connection of the test leads to the pair. A cursor 222 is provided along the TDR trace 220 to mark a disturbance in the balance TDR trace 220. The sharp rising edge of the rectangular TDR pulse 140 provides the high frequency energy that is reflected from an impedance change on the conductors 30a, 30b back to the receiver 124. As illustrated at the cursor 222, the amplitude of the sampled voltage signal drops significantly and then increases. The metallic reflections are illustrated as sharply changing voltages at the point of fault, allowing the location of the fault to be easily determined. This drop in voltage represents resistance between the first conductor 30a of the pair and ground at a distance of approximately 453.1 feet. The fault on the pair is therefore similar to the fault 91 illustrated in FIG. 4 and the drop in voltage relates to a resistance fault of approximately 2500Ω.

Figure 7:
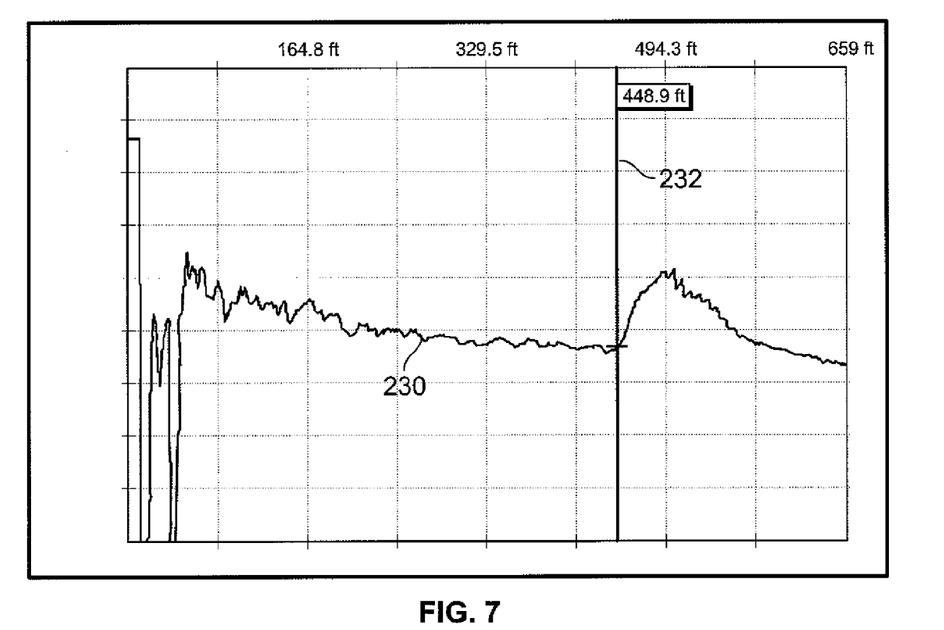
FIG. 7 is a view of the display of the present invention upon application of the test instrument to a pair including a 1KΩ resistance fault between ring and ground.

A balance TDR trace 230 is illustrated in FIG. 7 and is similar to the balance TDR trace 220. The balance TDR trace 230 includes a disturbance identified at the cursor 232. As illustrated at the cursor 232, the amplitude of the sampled voltage signal increases significantly and then decreases. This increase in voltage followed by the decrease in voltage represents resistance between the second conductor 30b of the pair and ground at a distance of approximately 448.9 feet. The fault on the pair is therefore similar to the fault 92 illustrated in FIG. 4 and the increase in voltage relates to a resistance fault of approximately 1 KΩ.

Comparing the balance TDR trace 220 of FIG. 6 and the balance TDR trace 230 of FIG. 7 it can be seen that the trace 220, 230 deflects upward or downward depending upon which conductor 30a or 30b is faulted. In addition, reversing the leads 106, 108 will also result in reversal of the deflection of the imbalance fault in the balance TDR trace.

Figure 8:
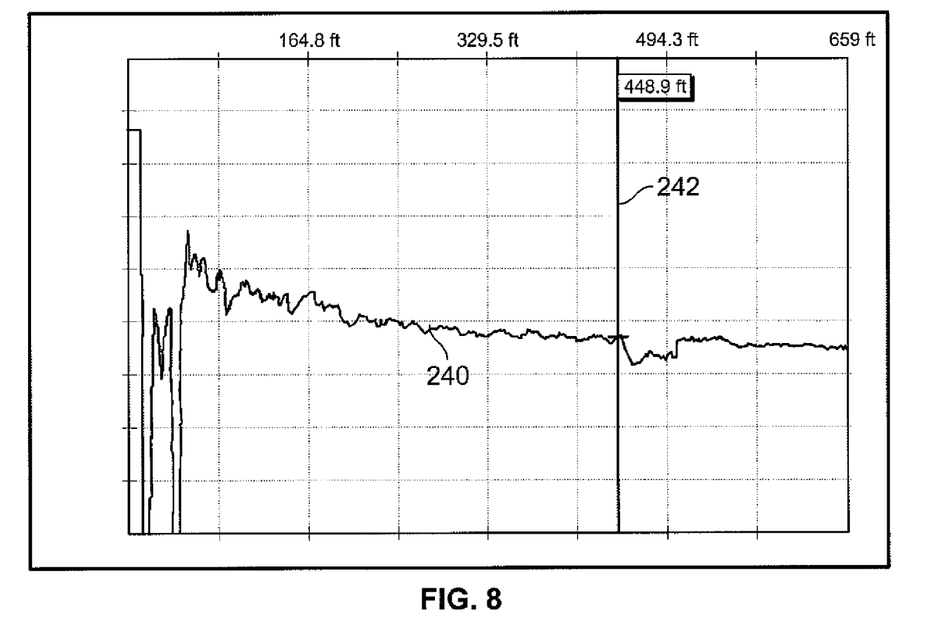
FIG. 8 is a view of the display of the present invention upon application of the test instrument to a pair including a 22 pF capacitance fault between tip and ground.

A balance TDR trace 240 is illustrated in FIG. 8. The balance TDR trace 240 includes a disturbance identified at the cursor 242. As illustrated at the cursor 242, the amplitude of the sampled voltage signal decreases significantly. This decrease in voltage represents capacitance between the first conductor 30a of the pair and ground at a distance of approximately 448.9 feet. The fault on the pair is therefore similar to the fault 93 illustrated in FIG. 4 and the decrease in voltage relates to a capacitance fault of approximately 22 pF.

Figure 9:
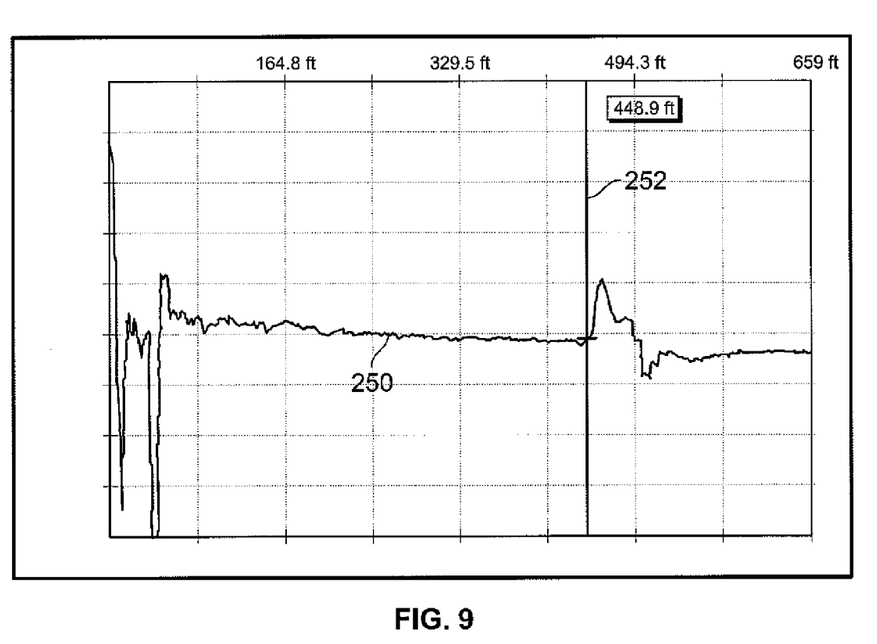
FIG. 9 is a view of the display of the present invention upon application of the test instrument to a pair including a 100 pF capacitance fault between ring and ground.

A balance TDR trace 250 is illustrated in FIG. 9. A cursor 252 is provided along the balance TDR trace 250 to mark a disturbance in the balance TDR trace 250. As illustrated at the cursor 252, the amplitude of the sampled voltage signal increases significantly and then decrease. This increase followed by a decrease in the magnitude of the sampled voltage signal represents capacitance between the conductor 30b of the pair and ground at a distance of approximately 448.9 feet. The fault on the pair is therefore similar to the fault 94 illustrated in FIG. 4 and the increase in voltage relates to a capacitance of approximately 100 pF.

Identification of imbalances using the circuit 50, 120 can be accomplished by configuring the microprocessor to detect a large slope change in the metallic signal. Configurations for identification of slope changes are currently employed by traditional TDR instruments and can be applied to the balance TDR test.

As illustrated by the traces provided, the TDR stress test provided by the circuit 50, 120 of the test instrument 100 allows a technician to locate and identify discrete imbalance faults which could impair high frequency transmission performance such as the transmissions used in DSL circuits ranging from 20 KHz up to and beyond 30 MHz. The method described is useful to detect balance faults caused by discrete events such as, for example, incorrect splicing, defective equipment attached to the line, or moisture in the cable.

As can be understood from the above description, the circuit 50 and the circuit 120 each provide a circuit which can be used to perform a balance stress test. Each circuit 50, 120 provides a pulse generator for initiation of TDR pulses and a simplex pulse output signal which results from the TDR pulses. The simplex pulse output signal is applied to an interface having first and second balanced pathways to said first and second conductors. Upon encountering an imbalance in said first and second conductors a metallic signal is provided at said interface and ultimately to an analog-to-digital converter which provides sampling of the metallic signal. Because the TDR pulses applied to the circuits 50, 120 of the present invention are applied in a simplex rather than metallic manner, the technician will identify the received metallic voltage signal as due imbalance faults. Because imbalance faults are particularly troublesome in DSL circuits, the circuits 50, 120 of the test instrument 100 are particularly beneficial for testing pairs used to provide DSL service. The microprocessor 23, 130 is configured to receive data collected as a result of said sampling and to present the data to the technician in a manner reflecting the balance/imbalance of the pair as described above.

In scenarios where the line under test is active, an AC signal such as a sine wave signal having a frequency which will not interfere with the active signal can be used to generate the time domain reflectometer pulses to allow testing of the balance of the line under test without interruption of the active signal. In scenarios where the line under test is inactive, an AC signal can be utilized to generate the time domain reflectometer pulses and the frequency of the AC signal can be varied to sweep the desired range of frequencies to be test. In this scenario, in order to fully characterize the wideband balance of the pair 30a, 30b, the technician must repeatedly apply and measure stress balance across the full range of frequencies of interest. Alternatively, for inactive lines, a wide band signal (i.e. one having wideband harmonic content), can be used to generate the time domain reflectometer pulses to allow the technician to fully characterize the wideband balance of a pair 30a, 30b by applying a single stress tone.

It is to be noted that the attenuation correction principals described with respect to the circuit 50 shown in FIG. 2 can also be applied to the circuitry 120 of FIG. 3. More specifically, the microprocessor 130 can be configured to adjust the data received by the analog-to-digital converter. For example, the time from initiation of the TDR pulse to receipt of the TDR pulse can be utilized to provide a multiplier to the data received. This multiplier will therefore allow faults at the far end of the line to be seen more clearly. In addition, the gauge of the cable may be utilized in providing an attenuation multiplier.

It is noted that the unlike the circuit 50 which requires a balanced resistive network 8, 9, 10, 11, the circuit 120 of the test instrument 100 utilizes a transformer 178 eliminating the need for careful balancing of the electrical pathways through the resistive network to the conductors of the pair. The transformer 178 also provides for isolation between the simplex output signal 174 and the metallic signal at the output terminals 186, 188 of the transformer 178.

While particular forms of the invention have been illustrated and described, it will be apparent that various modifications can be made without departing from the spirit and scope of the invention. Accordingly, it is not intended that the invention be limited except by the following claims. We claim:

We claim:

1. An apparatus for measuring imbalance in a paired line having a first conductor and a second conductor, the apparatus comprising:
   a first contact engagable with the first conductor of said line;
   a second contact engagable with the second conductor of said line;
   a third contact engagable with a ground connection;
   a time domain reflectometer pulse generator, wherein said time domain reflectometer pulse generator generates a time domain reflectometer pulse;

an interface having a first balanced pathway from said pulse generator to said first conductor and a second balanced pathway from said pulse generator to said second conductor;

wherein upon initiation of said time domain reflectometer pulse a simplex pulse output signal is applied to the first conductor through said first balanced pathway and to said second conductors through said second balanced pathway and said interface receives a metallic signal in response to impedance imbalances encountered by said simplex pulse output signal in the first and second conductors;

an analog-to-digital converter, wherein said analog-to-digital converter samples said metallic signal;

a microprocessor in communication with said analog-to-digital converter, wherein said microprocessor receives data relating to said samples, a memory for storing said data; and a display, wherein data is displayed on said display.

2. The apparatus of claim 1, wherein said time domain reflectometer pulse generator further provides a pulse initiation signal to said microprocessor to initiate sampling of said metallic signal.

3. The apparatus of claim 1, wherein said first and second balanced pathways include a center tapped resistor network.

4. The apparatus of claim 3, further including switches for matching the impedance of the apparatus to the impedance of the conductors.

5. The apparatus of claim 1, wherein said first and second balanced pathways include a center tapped transformer.

6. The apparatus of claim 5, further including a metallic terminating resistor across the output terminals of said center tapped transformer.

7. The apparatus of claim 1, further including a differential amplifier and said differential amplifier receives said metallic signal from said interface prior to sampling of said metallic signal by said analog-to-digital converter.

8. The apparatus of claim 7, wherein said differential amplifier has a high common mode rejection ratio.

9. The apparatus of claim 1, wherein said interface includes a first output and a second output and wherein said metallic voltage signal is provided at said first and second outputs and wherein the polarity of said metallic voltage signal at said first output is opposite the polarity of said metallic voltage at said second output.

10. The apparatus of claim 9, further including a differential amplifier and wherein said metallic voltage signal at said first output is provided to a first amplifier prior to sampling of said metallic voltage signal by said analog-to-digital converter and wherein said metallic voltage signal at said second output is provided to a second amplifier prior to sampling of said metallic voltage signal by said analog-to-digital converter.

11. The apparatus of claim 10, further including a coupling transformer and wherein said metallic voltage signal amplified by said first amplifier is provided to a first input of said coupling transformer and said metallic voltage signal amplified by said second amplifier is provided to a second input of said coupling transformer.

12. The apparatus of claim 1, further including a transmission transformer in communication with said time domain reflectometer pulse generator and said interface and wherein said simplex pulse output signal includes a positive pulse applied to a first input of said transmission transformer and a negative pulse applied to a second input of said transmission transformer and said positive pulse and said negative pulse are summed to provide said simplex pulse output signal.

13. The apparatus of claim 12, further including a positive pulse amplifier which amplifies said positive pulse prior to applying said positive pulse to said first input of said transmission transformer and a negative pulse amplifier which amplifier said negative pulse prior to applying said negative pulse to said second input of said transmission transformer.

14. The apparatus of claim 12, wherein said transmission transformer provides for addition of said positive pulse and said negative pulse to reduce noise from said simplex output signal.

15. The apparatus of claim 1, further including a first capacitor in communication with said first conductor for blocking DC signals to the receiver and a second capacitor in communication with said second conductor for blocking DC signals to the receiver.

16. The apparatus of claim 1, wherein said time domain reflectometer pulse includes wideband harmonic content.

17. The apparatus of claim 16, wherein said time domain reflectometer pulse is rectangular.

18. The apparatus of claim 16, wherein said time domain reflectometer pulse is saw toothed.

19. The apparatus of claim 1, wherein said time domain reflectometer pulse is associated with a selected frequency.

20. The apparatus of claim 19, wherein said selected frequency lies between the upstream DSL frequency and the downstream DSL frequency.

21. The apparatus of claim 1, wherein the data is provided on the display as a numeric balance reading.

22. The apparatus of claim 2, wherein said microprocessor is configured to calculate a delay based upon a time associated with said pulse initiation signal and a time associated with receipt of said data relating to said samples and to calculate a distance to said impedance imbalance based upon said calculated delay.

23. The apparatus of claim 1, wherein said data is provided on said display in the form of a balance time domain reflectometer trace.

24. The apparatus of claim 23 wherein the balance time domain reflectometer trace provides a plot of the amplitude of the imbalance versus the distance to the imbalance.

* * * * *